United States Patent
Saiki et al.

(10) Patent No.: US 6,509,953 B1
(45) Date of Patent: *Jan. 21, 2003

(54) APPARATUS FOR EXPOSING A PATTERN ONTO AN OBJECT WITH CONTROLLED SCANNING

(75) Inventors: Kazuaki Saiki, Tokyo (JP); Bausan Yuan, San Jose, CA (US)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/020,876

(22) Filed: Feb. 9, 1998

(51) Int. Cl.$^7$ .................. G03B 27/42; G03B 27/32; G01J 1/00
(52) U.S. Cl. .................. 355/53; 355/77; 250/491.1
(58) Field of Search .................. 355/43, 53, 67, 355/77, 55; 250/491, 548; 356/398, 399, 400, 401

(56) References Cited

U.S. PATENT DOCUMENTS

| | | | |
|---|---|---|---|
| 3,781,629 A | 12/1973 | Yashimoto et al. | 318/632 |
| 4,057,347 A | 11/1977 | Moriyama et al. | 355/67 |
| 4,634,946 A | 1/1987 | Moulds, III et al. | 318/561 |
| 4,742,376 A | 5/1988 | Phillips | 355/77 |
| 4,795,955 A | 1/1989 | Yamashita | 318/632 |
| 4,952,858 A | 8/1990 | Galburt | 318/647 |
| 4,972,311 A | 11/1990 | Holdgrafer et al. | 364/167.01 |
| 5,182,615 A | 1/1993 | Kurosawa et al. | 356/400 |
| 5,646,413 A * | 7/1997 | Nishi | 356/401 |
| 5,686,997 A * | 11/1997 | Shirasu | 356/401 |
| 5,777,722 A * | 7/1998 | Miyazaki et al. | 355/53 |
| 5,798,822 A * | 8/1998 | Miyazaki et al. | 355/53 |
| 5,850,280 A | 12/1998 | Ohtomo et al. | 355/53 |
| 5,877,845 A * | 3/1999 | Makinouchi | 355/53 |
| 5,907,392 A * | 5/1999 | Makinouchi | 355/53 |

FOREIGN PATENT DOCUMENTS

| | | |
|---|---|---|
| JP | 6114782 A | 4/1994 |
| JP | 6125691 A | 5/1994 |
| JP | 7-160063 | 6/1995 |

* cited by examiner

Primary Examiner—Russell Adams
Assistant Examiner—Peter B. Kim
(74) Attorney, Agent, or Firm—Skjerven Morrill LLP; Norman R. Klivans (57) ABSTRACT

A high-precision scanning positioning system with magnification and orthogonality correction. A scanning position system, such as a microlithographic system, has a mask fine stage and a plate fine stage mounted on a coarse stage that moves at a constant velocity during exposure. By moving one fine stage relative to the other fine stage in the same or opposite direction of the scan during the exposure of the plate, an increase or decrease in magnification may be achieved. Likewise, by moving one fine stage relative to the other fine stage perpendicular to the direction of the scan during the exposure, a change in orthogonality may be achieved, and by rotating one fine stage relative to the other, correction of any rotation error may be achieved. A position control apparatus controls the motion of the fine stage relative to the other fine stage, such that the scanning position system can simultaneously correct synchronous error between the fine stages and reduce settling time while changing the magnification and orthogonality.

17 Claims, 7 Drawing Sheets

APPARATUS FOR EXPOSING A PATTERN ONTO AN OBJECT WITH CONTROLLED SCANNING

FIELD OF THE INVENTION

The present invention relates to controlling a high-precision positioning system. More particularly, the present invention relates to achieving a desired magnification and orthogonality in a scanning microlithographic system.

BACKGROUND

High-precision positioning systems, such as those used in machining tools or lithography, drive components of the system in accordance with a defined path within narrow tolerances. The path may have one direction, e.g., the X coordinate, or two directions, e.g., the X and, orthogonal Y coordinates. Typically in a scanning microlithography apparatus for semiconductor wafer processing, a stage is used to position a mask (reticle) in two dimensions, while a separate stage is used to position the plate (wafer). The stages are both carried upon a coarse stage that moves at a constant velocity during exposure of the plate. The entire system is supported by a base structure along with other components such as a source of radiant energy and a projection lens to focus the energy.

Figure 1:
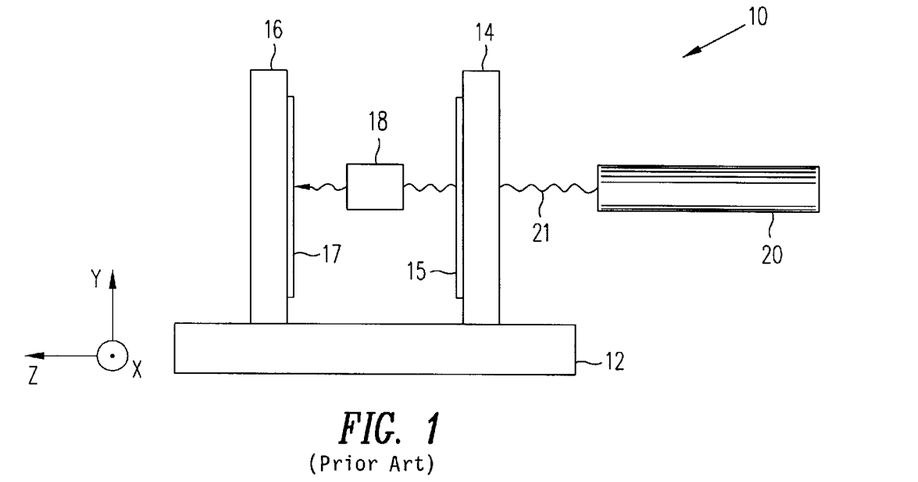
FIG. 1 shows a front view of a simplified scanning microlithographic positioning table mechanism.
Figure 2:
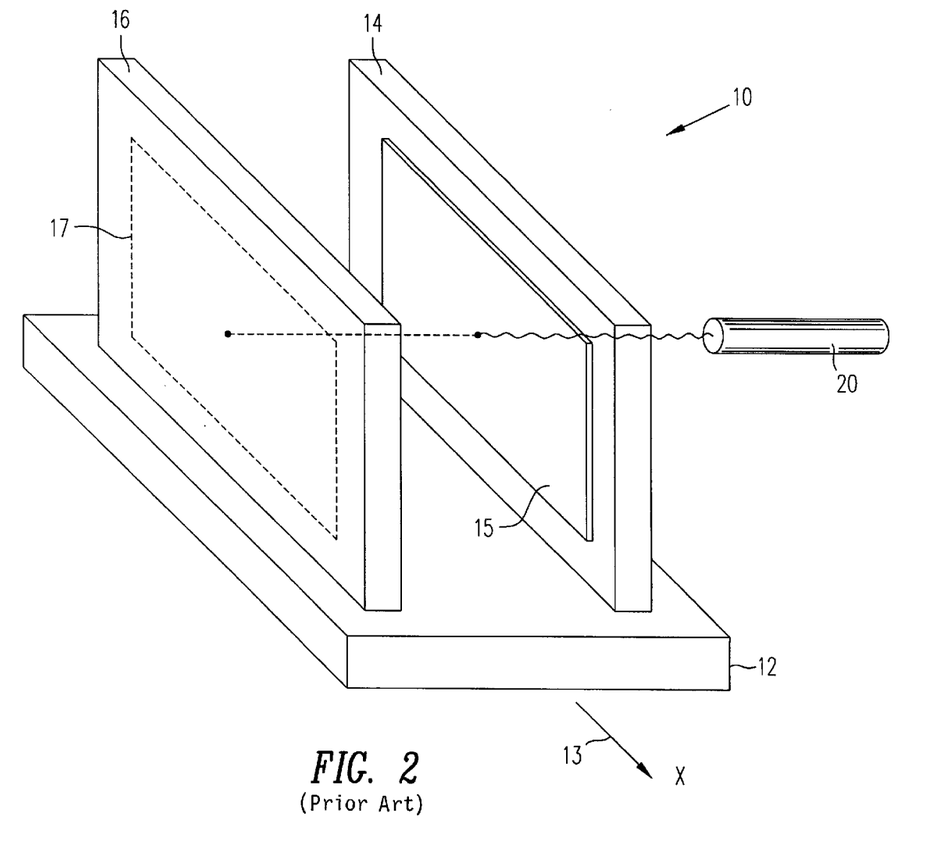
FIG. 2 shows a perspective view of a simplified scanning microlithographic positioning table mechanism.

FIGS. 1 and 2 show a respective front view and perspective view of a simplified scanning microlithographic positioning table mechanism 10. Table mechanism 10 includes a coarse stage 12; a mask fine stage 14, which holds a mask (reticle) 15; and a plate fine stage 16, which holds a plate (wafer) 17. FIG. 1 also shows a projection lens 18 and an illumination apparatus 20, which produces a light beam 21 for exposing plate 17. Coarse stage 12 is supported by a base structure (not shown) containing an antivibration device and anti-friction bearings, such as air bearings or roller bearings, as is well known in the art. Coarse stage 12 is conventionally driven at a constant velocity in the X coordinate direction, as illustrated by arrow 13 in FIG. 2, during exposure of plate 17. Illumination apparatus 20 and projection lens 18 remain relatively stationary.

Mask fine stage 14 and plate fine stage 16, which are attached to coarse stage 12, move at the same velocity during exposure of plate 17. Thus, in theory table mechanism 10 has a magnification of 1:1, i.e., the area of mask 15 that is scanned across illumination apparatus 20 is equal to the area of plate that is exposed. Additionally, because mask fine stage 14 and plate fine stage 16 are attached to coarse stage 12 and move at the same velocity, the magnification factor and orthogonality factor of table mechanism 10 are fixed.

Figure 5A:
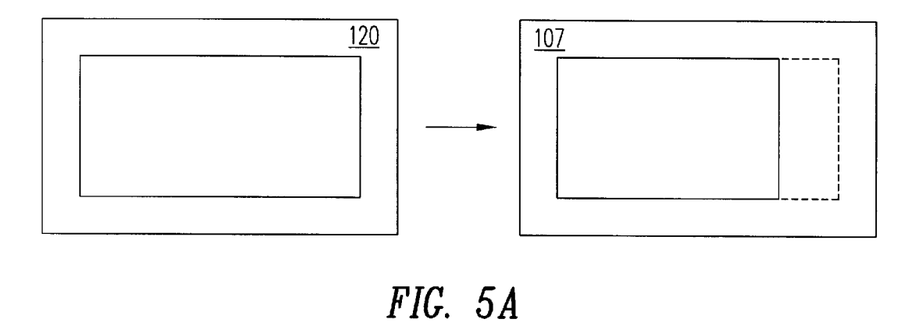
FIGS. 5A, 5B, and 5C illustrate the respective magnification and orthogonality changes of an exposed image on a plate.
Figure 5B:
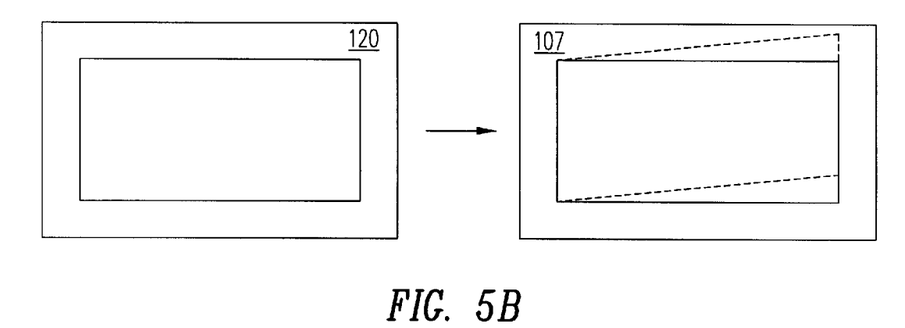

In practice, however, there may be error in the magnification caused by projection lens 18 or synchronous error caused by the motion of coarse stage 12. Additionally, the projection lens 18 and synchronous error may create error in the orthogonality of the exposed image. Orthogonality error results in the image from mask 15 being reproduced on plate 17 in a skewed manner (an example of orthogonality error is shown in FIG. 5B). These errors result in poor quality and low resolution of the exposed image. Thus, it is advantageous to correct magnification and orthogonality error in the positioning system or change the magnification factor or orthogonality factor to a desired value.

SUMMARY

A scanning positioning system in accordance with the present invention moves one fine stage relative to the another fine stage to correct magnification and orthogonality error or to change the magnification or orthogonality factors to a desired level. A scanning position system, such as a microlithographic system, has a mask fine stage and a plate fine stage mounted on a coarse stage that moves at a constant velocity during the exposure of the plate. The position of one fine stage is measured relative to the other fine stage. With this position information, one of the fine stages may be moved by an appropriate amount in the same or opposite direction of the scan to increase or decrease the magnification. Thus, the scanning position system can change the magnification factor to a desired level, as well as a correct any magnification error or any rotation error. Likewise, by moving one of the fine stages by an appropriate amount in a direction perpendicular to the scan, the system can change the orthogonality factor by a desired amount, as well as correct any orthogonality error.

In one embodiment of the present invention, the mask fine stage has a mask frame attached to the coarse stage. A mask holder is attached to the mask frame via actuators that move the mask holder relative to the mask frame and the coarse stage. A position control apparatus receives information regarding the position of the mask fine stage relative to the plate fine stage. Based on this position information, the position control apparatus sends commands to the actuators to move the mask holder relative to the plate fine stage by an amount necessary to achieve the desired magnification and orthogonality. The position control apparatus can also be used to simultaneously compensate for any synchronous error between the fine stages and reduce the settling time of the system.

DETAILED DESCRIPTION

Figure 3:
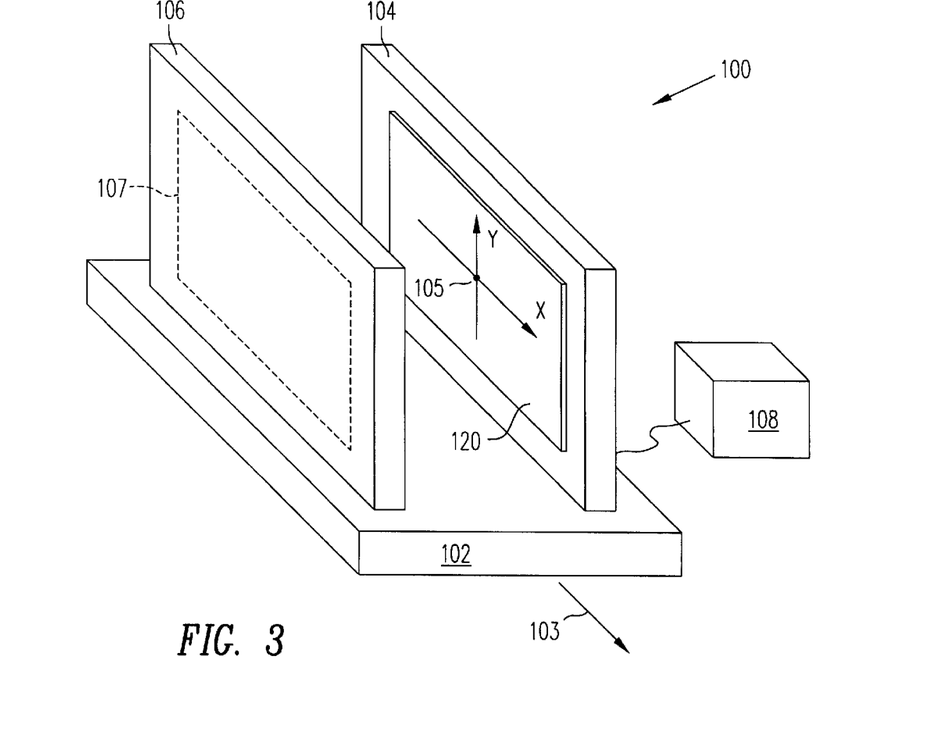
FIG. 3 shows a perspective view of a scanning microlithographic system including a position control apparatus in accordance with the present invention.

FIG. 3 shows a simplified perspective view of a scanning microlithographic system 100 in accordance with the present invention. Microlithographic system 100 includes a coarse stage 102 that carries a mask fine stage 104 and a plate fine stage 106. Plate fine stage 106 holds a plate (wafer) 107, while mask fine stage 104 holds a mask (reticle) 120. System 100 also includes a position control apparatus 108, such as a digital signal processor or micro-processor. Although the present invention is described with reference to a scanning microlithographic system, it is understood that the present invention applies to other high-precision positioning systems as well. Conventional details of stages 102, 104, and 106 are not shown. For information relating to the workings of an exemplary suitable position control apparatus, see the copending application entitled "POSITION CONTROL APPARATUS FOR FINE STAGES CARRIED BY A COARSE STAGE ON A HIGH-PRECISION SCANNING POSITIONING SYSTEM," by Bausan Yuan, and Kazuaki Saiki, application Ser. No. 09/045,218, the contents of which are incorporated herein by reference. Other conventional position control apparatuses may also be used.

During scanning, coarse stage 102 moves along in the X coordinate direction, as indicated by arrow 103. Position control apparatus 108 controls the movement of coarse stage 102 by updating the desired position for coarse stage 102 over many cycles during the scan. It will be appreciated that position control apparatus 108 may also control the movement of coarse stage 102 through other methods such as controlling the velocity or acceleration of coarse stage 102.

The position control apparatus 108 also controls movement of mask 120 on mask fine stage 104 during scanning, such that mask 120 moves along both the X and Y coordinate directions relative to plate 107, as illustrated by arrows 105. Position control apparatus 108 controls the movement of mask 120 by updating the desired position for mask 120 at each cycle during the scan or by controlling the velocity of mask 120.

Position control apparatus 108 produces a change in the magnification or orthogonality of the exposed image on plate 107 on plate fine stage 106 by moving mask 120 relative to plate 107 such that mask 120 has a velocity proportional to a magnification factor or orthogonality factor. By moving mask 120 relative to plate 107, position control apparatus 108 can increase or decrease the magnification and orthogonality when desired, as well as compensate for any error in the magnification or orthogonality of microlithography system 100 caused by the projection lens or synchronous error.

During exposure, coarse stage 102 moves along the X coordinate at a constant velocity. To increase or decrease magnification, position control apparatus 108 moves mask 120 in the X coordinate direction at a velocity proportional to the magnification factor. Thus, if a magnification factor of 1.1 to 1 is desired, mask 120 is moved relative to plate 107 at 0.1 times the speed of coarse stage 102.

Figure 4A:
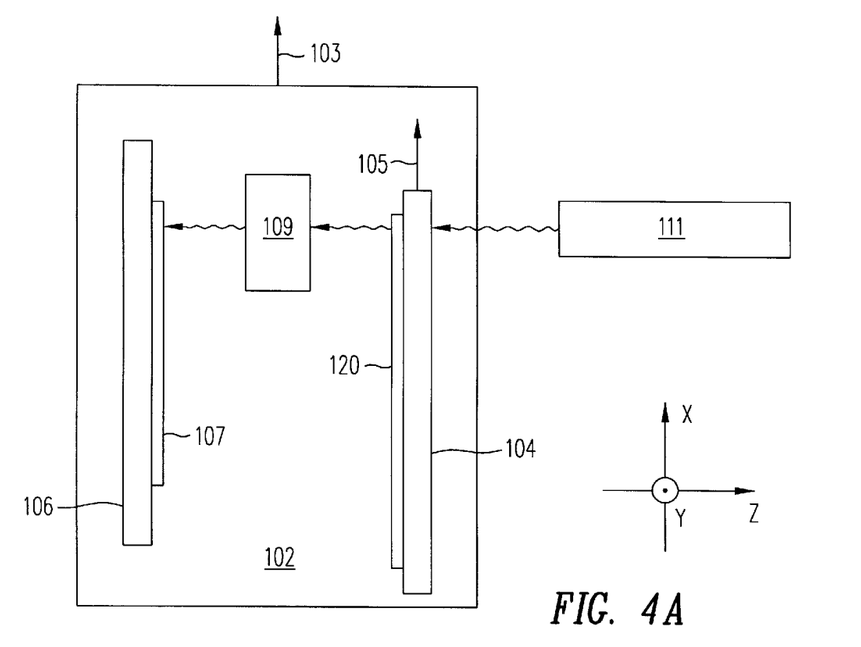
FIGS. 4A, 4B, 4C show the beginning, middle and end, respectively, of the exposure of a plate on the plate fine stage during the scanning process.
Figure 4B:
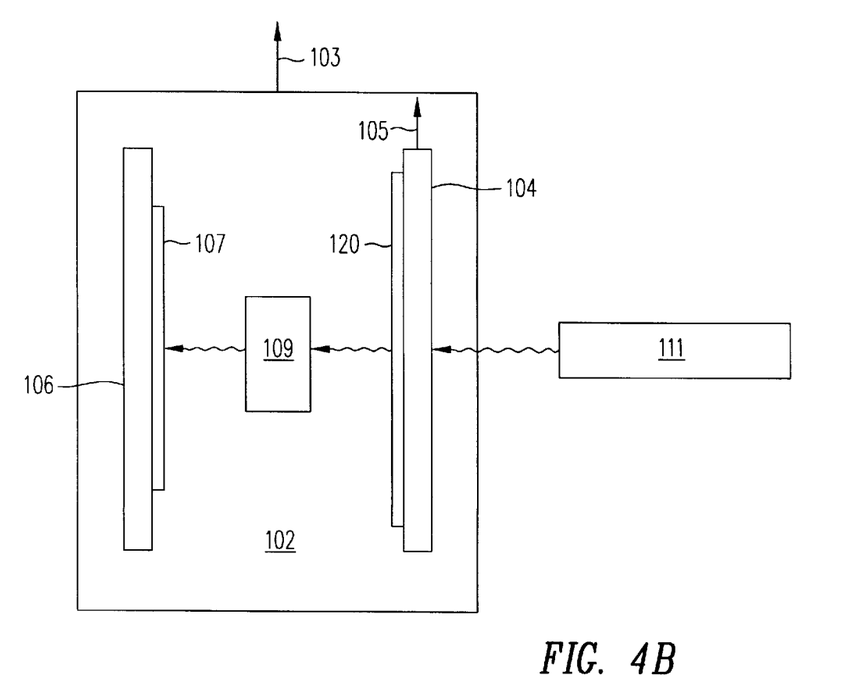
Figure 4C:
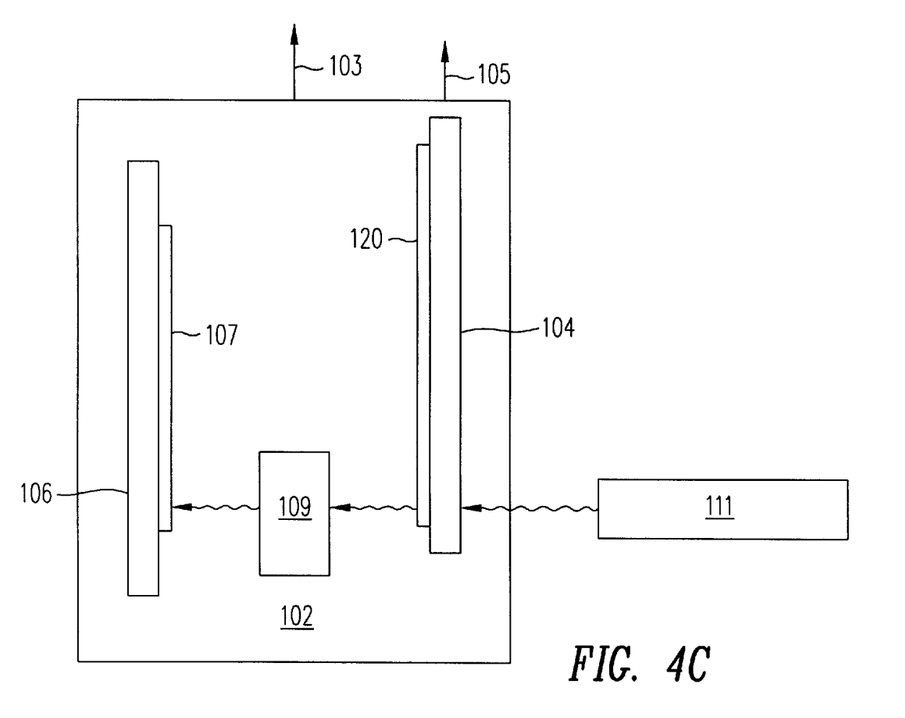

FIGS. 4A, 4B, and 4C show the respective beginning, middle and end of a scan in the X coordinate direction while plate 107 on plate stage 106 is being exposed. Position control apparatus 108 shown in FIG. 3, moves coarse stage 102 across a conventional illumination source 111 and projection lens 109, as indicated by arrow 103, such that coarse stage 102 has a constant velocity Vc relative to illumination source 111 and projection lens 109. As shown in FIG. 4A, when fine stages 104, 106 are at the beginning exposure point, mask fine stage 104, which is carrying mask 120, is moved by position control apparatus 108, as indicated by arrow 105, such that mask fine stage 104 moves at a predetermined velocity $V_m$ in the X coordinate direction.

The predetermined velocity $V_m$ of mask fine stage 104 is relative to plate fine stage 106. Plate fine stage 106 does not move relative to coarse stage 102 in this embodiment, however, it is understood that plate fine stage 106 may move relative to coarse stage 102 if mask fine stage 104 maintains a velocity Vm relative to plate fine stage 106. Position control apparatus continues to move mask fine stage 104 at velocity Vm relative to plate fine stage 106 until reaching the end of the scan, shown in FIG. 4C.

Although the entire mask fine stage 104 is shown moving relative to plate fine stage 106 in FIGS. 4A–4C, one skilled in the art will appreciate that the magnification and orthogonality correction is achieved through the motion of mask 120 relative to plate 107. Accordingly, it is understood that mask fine stage 104 may remain stationary relative to coarse stage 102, while mask 120 is moved at a velocity Vm relative to plate 107.

Figure 4D:
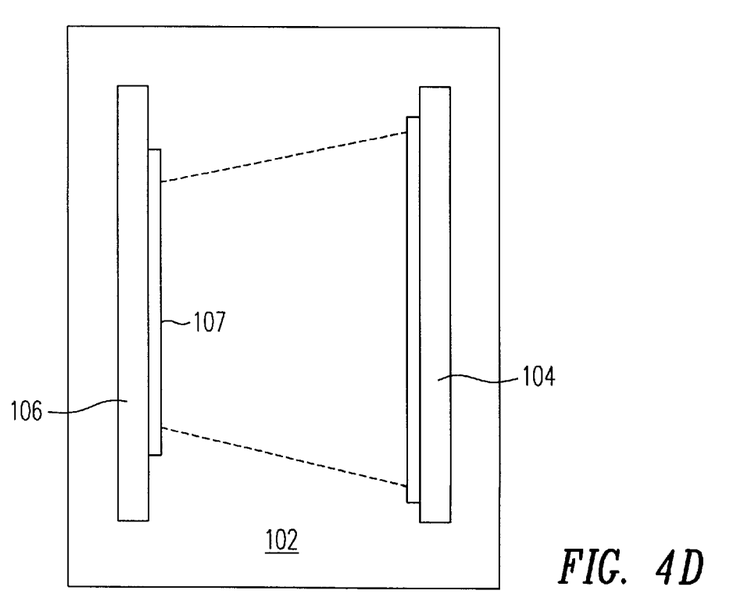
FIG. 4D illustrates the change of magnification in accordance with the present invention.

FIG. 4D illustrates the length of mask fine stage 104 that was scanned in front of illumination source 111 (not shown in FIG. 4D) with respect to the length of plate fine stage 106 that was exposed by illumination source 111 during the scan. Thus, FIG. 4D illustrates the magnification achieved by mask fine stage 104 maintaining a velocity Vm relative to plate fine stage 106 during exposure. This magnification can also be seen in FIG. 5A, which illustrates the transfer of the pattern on mask 120 to plate 107. As illustrated, the exposed image on plate 107 is smaller than the unmagnified image (shown with dashed lines) that would have been exposed if there was no change in the magnification factor.

Orthogonality of the exposed image may be controlled by moving mask 120 at a velocity proportional to the orthogonality factor in the Y coordinate direction (perpendicular to the scanning direction of coarse stage 102) during exposure of plate 107. The orthogonality correction can be seen in FIG. 5B, which illustrates the transfer of the pattern on mask 120 to plate 107. As illustrated, the exposed image on plate 107 has no orthogonal error in contrast with the image (shown with dashed lines) that would have been exposed if there was no orthogonality correction.

Figure 5C:
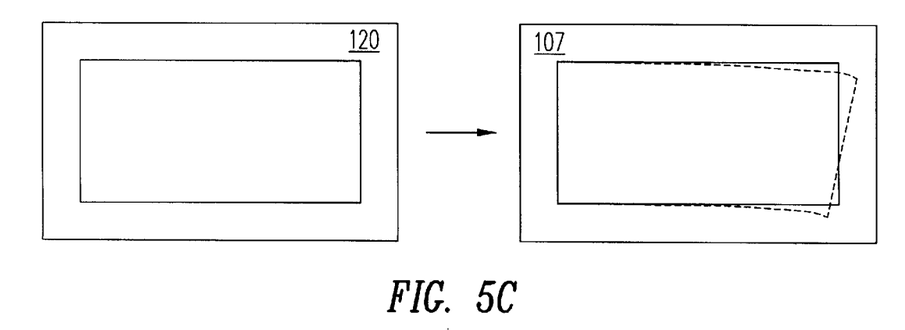

In addition, rotation error may be corrected by rotating mask 120 by an appropriate amount during the scan. FIG. 5C illustrates the correction of rotation error on plate 107. The image that would have been exposed on plate 107 without correction of the rotation error is shown with dashed lines. Rotation error occurs due to thermal stress (distortion) generated during the exposure of plate 107. Thus, position control apparatus 108, shown in FIG. 3, may control actuators 114, 116, and 118, shown in FIG. 6, to rotate mask 120 to correct for any rotation error during the exposure.

It is understood that by moving mask 120 in both the X and Y coordinates during exposure of plate 107, a change in the magnification factor may be achieved simultaneously with a change in the orthogonality factor and correction of any rotation error.

Figure 6:
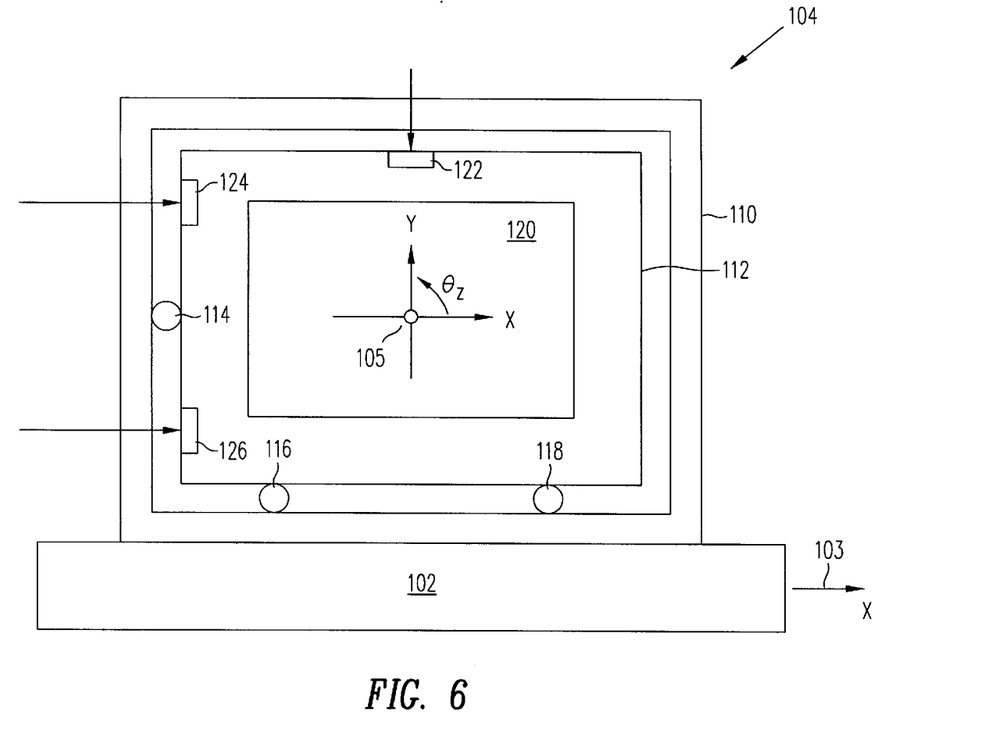
FIG. 6 shows a side view of a mask fine stage, including a mask frame and mask holder with actuators disposed between, in accordance with one embodiment of the present invention.

FIG. 6 shows a side view of mask fine stage 104, in accordance with one embodiment of the present invention. Mask fine stage 104 includes a mask frame 110 that is attached to coarse stage 102. A mask holder 112 is connected to mask frame 110 via actuators 114, 116, and 118. Mask 120 is held by mask holder 112 in a conventional manner, as is well understood by those skilled in the art. Actuators 114, 116, and 118 are disposed between mask holder 112 and mask frame 110 such that they can move mask holder 112 in the X, Y, and $\theta_z$ coordinates as shown by arrow 105, while coarse stage 102 moves at a constant velocity in the X coordinate as shown by the arrow 103. It is understood that reference to the motion of mask 120 includes the motion of mask holder 112 while mask frame 110 remains stationary relative to coarse stage 102.

As shown in FIG. 6, actuator 114 moves mask holder 112 along the X coordinate, while actuators 116 and 118 move mask holder 112 in the Y coordinate when they are simultaneously moved in the same direction. Actuators 116 and 118 also move mask holder in the $\theta_z$ direction if one actuator is moved in one direction more than the other actuator, however, the $\theta_z$ coordinate is unnecessary to change the orthogonality or magnification of the exposed image.

To control the accuracy of the system, the actual position of mask 120 must be measured relative to a known fixed position and relative to plate 107. The actual position of mask holder 112 can be measured by a conventional position measurement system, such as an interferometer. FIG. 6 shows reflectors (mirrors) 122, 124, and 126 mounted on mask holder 112, which are used by an interferometer (not shown), via incident light beams to measure the position of mask holder 112 in the X, Y, and $\theta_z$ coordinates. Because interferometers are differential devices, the position of mask holder 112 is measured relative to another component of the microlithographic system, such as projection lens 109, to obtain the actual position of mask holder 112. The position of mask holder 112 is also measured relative to plate stage 106. Thus, plate stage 106 also has reflectors mounted on it (not shown) to measure its position in the X, Y, and $\theta_z$ coordinates. With the information regarding the position of mask holder 112, the position of mask 120 may be calculated. Measuring the current location of a stage with interferometers is well known to those skilled in the art.

In an alternative embodiment, mask holder 112 is connected to coarse stage 102 via actuators 114, 116, 118, obviating the need for mask frame 110. In such an embodiment, actuators 116 and 118 are disposed between mask holder 112 and coarse stage 102 and are used to move mask holder 112 in the Y and $\theta_z$ coordinate directions. Actuator 114 may be directly attached to coarse stage 102 and used to directly move mask holder 112 along the X coordinate. Thus, in this embodiment, the entire mask fine stage 104 moves relative to plate 107.

Figure 7:
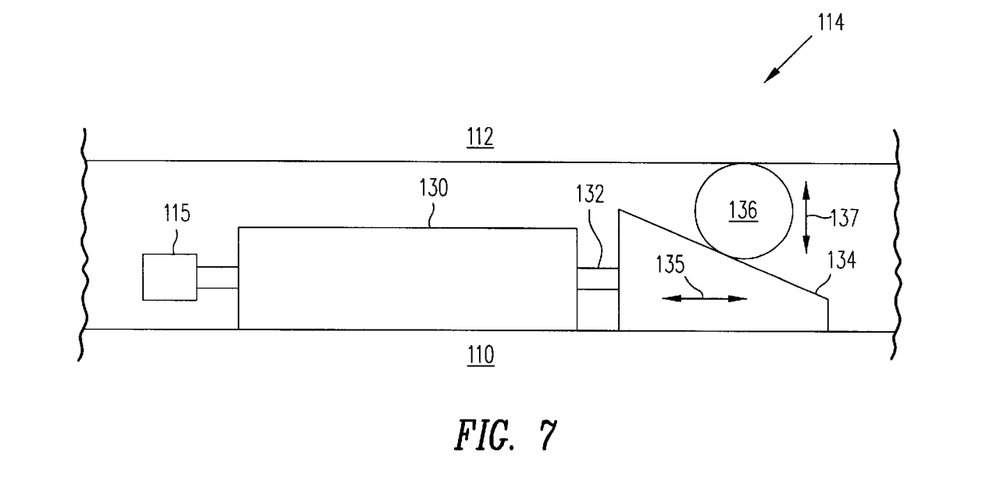
FIG. 7 shows a close up side view of an actuator disposed between the mask frame and mask holder.

FIG. 7 shows a close up side view of an example of actuator 114, including an attached encoder 115. It is understood that actuators 116 and 118 are the same as actuator 114. Actuator 114, which is e.g. a voice-coil actuator, includes a voice coil or other suitable motor 130 attached to mask frame 110. Motor 130 moves a shaft 132, which drives a wedge 134 in a direction parallel to mask frame 110, as shown by arrow 135. The movement of wedge 134 is translated to a roller 136, which moves perpendicularly to mask frame 110 due to wedge 134, as shown by arrow 137. Roller 136 is in contact with mask holder 112, and thus the perpendicular motion of roller 136 is thereby translated to mask holder 112. It is understood that actuator 114 is shown by way of example, and other actuators may be alternatively used, including, for example, other types of electromagnetic actuators and screw type actuators.

An encoder 115 is directly attached to shaft 132 of actuator 114 to determine the amount of drive provided to mask holder 112 through actuator 114. Encoder 115 measures the position of actuator 114. Position control apparatus 108 uses the position information from encoder 115 to measure the rate of change of position of actuator 114, which is approximately a measure of the velocity of mask holder 112 relative to coarse stage 102. Because encoder 115 is directly attached to actuator 114, any flexation or vibration of mask holder 112 will have little affect on the measurement of the velocity of mask holder 112. Additional encoders are likewise directly attached to respective actuators 116 and 118.

Actuators 114, 116, 118, shown in FIG. 6, are controlled by position control apparatus 108, shown in FIG. 3. Position control apparatus 108 receives position of fine stages 104, 106 through the use of interferometers and the encoders attached to actuators 114, 116, and 118. Using this information, position control apparatus 108 control the motion of mask 120 through actuators 114, 116, 118 such that mask 120 has a velocity proportional to plate 107 that is proportional to the desired magnification or orthogonality factor. For example, where no magnification or orthogonality factor is desired, position control apparatus 108 moves mask 120 such that mask 120 and plate 107 remain aligned in the X and Y coordinates. Thus, any magnification or orthogonality error is corrected. However, where, for instance, a magnification factor of 1.1 is desired, position control apparatus 108 updates the X coordinate position of mask 120 relative to plate 107 by an amount equal to ten percent of each change in the X coordinate position of coarse stage 102. Consequently, mask 120 moves relative to plate 107 at ten percent of the velocity of coarse stage 102.

While correcting the magnification or orthogonality of the exposed image, position control apparatus 108 may simultaneously dynamically correct the synchronous error between mask fine stage 104 and plate fine stage 106, such as that caused by yaw and roll of coarse stage 102. In addition, position control apparatus 108 may reduce the settling time for coarse stage 102 to accelerate to the constant velocity. Control of the synchronous error and reduction of settling time are described in the above-referenced copending application entitled "POSITION CONTROL APPARATUS FOR FINE STAGES CARRIED BY A COARSE STAGE ON A HIGH-PRECISION SCANNING POSITIONING SYSTEM," by Bausan Yuan, and Kazuaki Saiki, application Ser. No. 09/045,218.

Figure 8A:
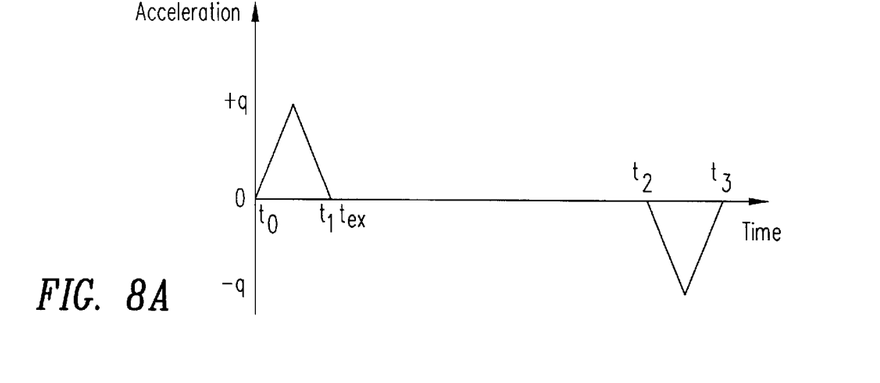
FIGS. 8A, 8B, 8C, and 8D are graphic representations of the respective acceleration, velocity of the coarse stage, velocity of the fine stage, and position in the X coordinate of the coarse stage in relation to time during a scan.
Figure 8B:
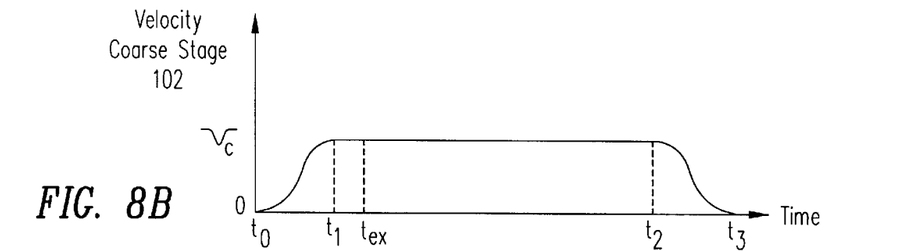
Figure 8C:
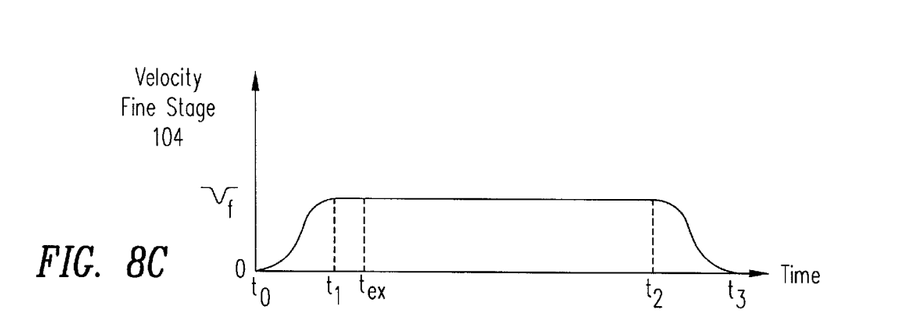
Figure 8D:
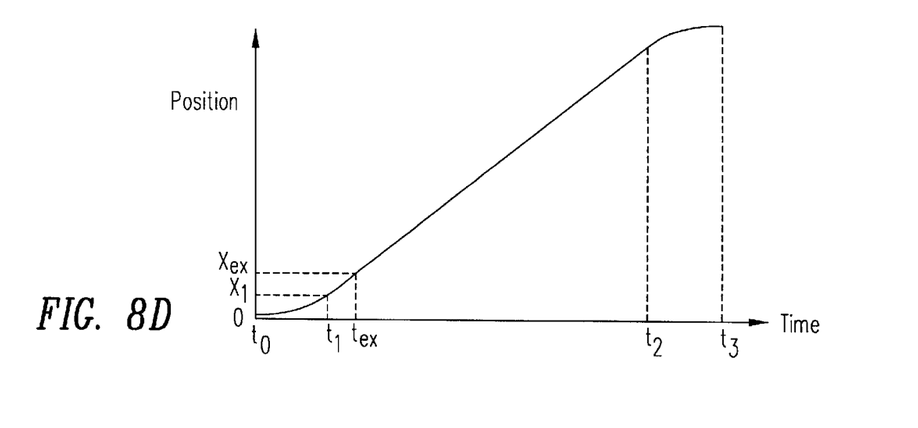

FIGS. 8A, 8B, and 8D are graphic representations of the respective acceleration, velocity and position in the X coordinate of coarse stage 102 in relation to time during a scan, while FIG. 8C represents the velocity of fine stage 104 in the X coordinate in relation to time. During scanning, coarse stage 102 is moved by position control apparatus 108, shown in FIG. 3, such that coarse stage 102 is stationary at time t0 and is moving at a constant velocity Vc at time t1, as shown in FIGS. 8A and 8B. Exposure of plate 107 on plate fine stage 106 does not occur until coarse stage 102 has reached an exposure point $X_{ex}$ at time $t_{ex}$, as shown in FIG. 8D, by which time coarse stage 102 is at the desired constant velocity Vc, as shown in FIG. 8B. Coarse stage 102 continues to move at constant velocity Vc until time t2, when exposure of plate 107 ends and coarse stage 102 begins to decelerate. Thus, the exposure of plate 107 occurs between times $t_{ex}$ and t2. FIG. 8C shows the velocity of mask fine stage 104 in the X coordinate with respect to time. As can be seen in FIG. 8C, mask fine stage 104 begins moving at time t0 and by time $t_{ex}$ mask fine stage 104, which carries mask 120, has reached a constant velocity vf. Mask 120 must reach a desired position relative to plate 107 at time $t_{ex}$ to achieve the desired synchronization between mask 120 and plate 107. Thus, beginning the motion of mask 120, such as at time t1, when mask 120 and plate 107 are aligned will result in a following error with mask 120 and plate 107 not properly synchronized. To avoid a following error, mask 120 is prepositioned relative to plate 107 before the scan begins.

Figure 9:
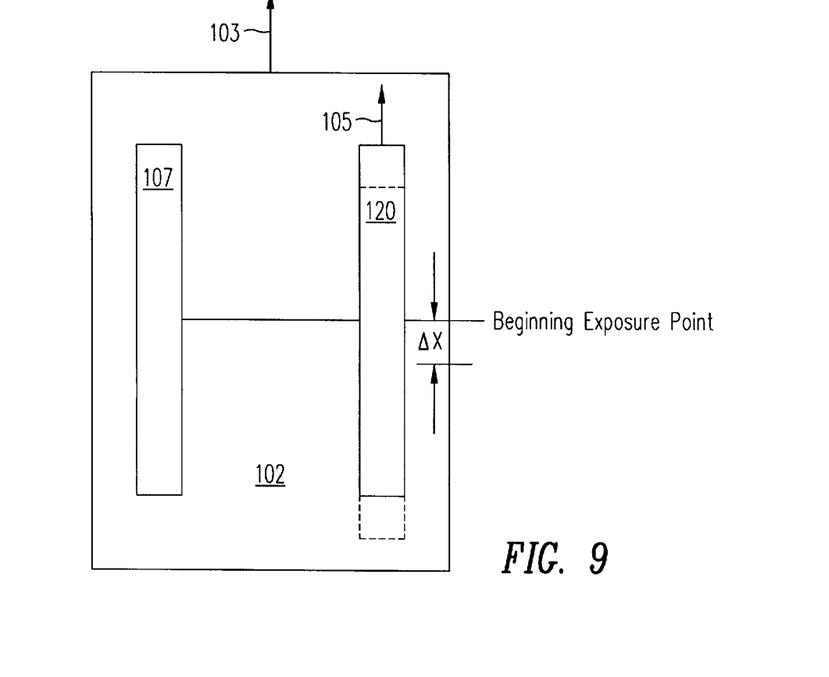
FIG. 9 shows a top view of coarse stage carrying a prepositioned mask and plate in relation to the beginning exposure point.

FIG. 9 shows a top view of mask 120 and plate 107 carried on coarse stage 102 in relation to the beginning exposure point. Mask fine stage 104 and plate fine stage 106 are not shown in FIG. 9 for clarity of explanation. For simplicity sake, the beginning exposure point is illustrated as being at the point when mask 120 and plate 107 are aligned. Prior to the beginning of the scan as illustrated in FIGS. 8A-8D, mask 120 is prepositioned in the negative X direction by a distance ΔX according to the following:

$$\Delta X = X_{ex}(b-1) \qquad \text{equ. 1}$$

where $X_{ex}$ is the distance traveled by coarse stage between time t0 and $t_{ex}$, and b is the magnification factor. The prepositioned mask 120 is indicated in FIG. 9 with the broken lines.

When coarse stage 102 begins to move in the X coordinate direction, indicated by arrow 103, at time t0, mask 120 will begin to move in the direction, as indicated by arrow 105, to synchronize with plate 107. Mask 120 will travel a distance ΔX by time $t_{ex}$ and, thus, mask 120 and plate 107 will be properly aligned at time $t_{ex}$, at which time exposure of plate 107 occurs.

Position control apparatus 108 provides to actuators 114, 116, and 118 an update to the desired position of mask 120 during each update cycle of position control apparatus 108, shown in FIG. 3, based on the desired position of coarse stage 102 and the magnification factor according to the following:

$$Xm = X(b-1) \qquad \text{equ. 2}$$

where Xm is the desired position value of mask 120, X is the desired position value of coarse stage 102, and b is the magnification factor. It is appreciated that where position control apparatus 108 controls the movement of mask 120 by controlling the velocity of mask 120, the magnification factor is multiplied by the desired velocity of coarse stage 102.

Additionally, feedforward signals are generated by position control apparatus 108 and provided to actuators 114, 116, and 118 to compensate for following error and to reduce settling time. The feedforward signals are generated by multiplying the command trajectory velocity V and the magnification factor (b−1). Consequently, when the exposure of plate 107 begins at time $t_{ex}$ mask 120 and plate 107 will be in proper alignment and mask 120 will already be moving at a rate that is proportional to the desired magnification factor. It is understood that where a decrease of magnification is desired, mask 120 is prepositioned an amount ΔX in the scanning direction prior to beginning the scan because mask 120 moves in the opposite of the scanning direction during exposure.

Similarly, when a change in orthogonality of the exposed image is desired, mask 120 may be prepositioned in the negative direction that mask 120 will be traveling during the exposure of plate 107. The amount of the preposition is based on the desired orthogonality factor such that:

$$\Delta Y = X_{ex}(p-1) \qquad \text{equ. 3}$$

where $X_{ex}$ is the distance traveled by coarse stage between time t0 and $t_{ex}$, and p is the orthogonality factor.

While the present invention has been described in connection with specific embodiments, variations of these embodiments will be obvious to those of ordinary skill in the art. For example, mask holder 112 may be connected directly to coarse stage 102, thus obviating the need for mask frame 110. Further, fine stages 104, 106 can be modified such that change in magnification and orthogonality is achieved by moving plate fine stage 106 while holding mask fine stage 104 stationary. Therefore, the spirit and scope of the appended claims should not be limited to the foregoing description.

What is claimed is:

1. An exposure apparatus which exposes a pattern of a mask onto an object while the mask and the object are moving in a scanning direction, comprising:
    a first stage that moves the mask in the scanning direction;
    a second stage that moves the object in the scanning direction;
    a third stage that is moveable relative to said first stage to position said mask, and third stage holding said mask;
    a drive located between the first stage and the third stage to drive said third stage relative to said first stage; and
    a control device having a microprocessor to control at least the first stage and third stage by the drive, said control device initiating a movement of the first stage and a movement of the third stage relative to said first stage at the same time prior to a start of an exposure operation that exposes the pattern onto the object and moving said first stage and said third stage at a constant velocity during the exposure operation to suppress a following error between the mask and the object in the scanning direction.

2. The exposure apparatus of claim 1 wherein movement of the first stage and the third stage occurs substantially synchronously.

3. The exposure apparatus of claim 2 wherein movement of the third stage is at an approximately constant velocity by a time $t_{ex}$ at the start of the exposure operation.

4. The exposure apparatus of claim 3 wherein the movement of the third stage is maintained at the constant velocity during the exposure operation.

5. The exposure apparatus of claim 1 wherein the control device controls the movement of the third stage along the first coordinate relative to the second stage at a first velocity proportional to the desired magnification factor.

6. The exposure apparatus of claim 1 wherein the control device controls the movement of the third stage along a second coordinate relative to the second stage at a second velocity proportional to the desired orthogonality factor, the second coordinate being orthogonal to the first coordinate.

7. The exposure apparatus of claim 1, wherein said first stage and said second stage are formed integrally.

8. The exposure apparatus of claim 1, wherein said drive keeps on driving said third stage at least from said time $t_o$ to a time $t_{ax}$ at a start of the exposure operation.

9. The exposure apparatus of claim 8, wherein said drive keeps on driving said third stage during the exposure operation.

10. The exposure apparatus of claim 1, wherein the second stage holds the object and the third stage holds the mask.

11. The exposure apparatus of claim 1, wherein said control device controls the movement of the third stage relative to the second stage to obtain desired magnification and orthogonality factors.

12. An exposure apparatus which exposes a pattern of a mask onto an object while the mask and the object are moving in a scanning direction, comprising:
    a first stage the moves said mask;
    a second stage that moves said object in the scanning direction;
    a third stage that is moveable relative to said first stage to position said mask, the third stage holding said mask; and a drive located between the first stage and the third stage to drive said third stage relative to said first stage such that the third stage is dislocated relative to said first stage prior to a start of an exposure operation that exposes the pattern onto the object to suppress a following error between the mask and the object in the scanning direction during the exposure operation.

13. The exposure apparatus of claim 12 wherein movement of the third stage begins at a time $t_o$ prior to the exposure operation occurring such that the mask and the object are aligned at a time $t_{ex}$ at a start of the exposure operation.

14. The exposure apparatus of claim 13, further comprising a position control device to control the movement of the third stage relative to the second stage to obtain desired magnification and orthogonality factors.

15. The exposure apparatus of claim 12 wherein the third stage moves at a constant velocity relative to the second stage during the exposure operation.

16. The exposure apparatus of claim 12, wherein said first stage and said second stage are formed integrally.

17. The exposure apparatus of claim 12, wherein the third stage is dislocated relative to said first stage based on a moving distance of the first stage during acceleration period of the first stage.

* * * * *